United States Patent [19]
Vanden Brande et al.

[11] Patent Number: 6,099,667
[45] Date of Patent: Aug. 8, 2000

[54] PROCESS FOR ANNEALING A MOVING METAL SUBSTRATE

[75] Inventors: Pierre Vanden Brande, Brussels; Alain Weymeersch, Wavre; Philippe Harlet, Charleroi, all of Belgium

[73] Assignee: Recherche et Developpement du Groupe Cockerill Sambre, Liege, Belgium

[21] Appl. No.: 09/021,113

[22] Filed: Feb. 10, 1998

[30]     Foreign Application Priority Data

Feb. 11, 1997 [BE] Belgium ................................ 09700125

[51] Int. Cl.⁷ ..................................................... H01J 37/32
[52] U.S. Cl. ...................................... 148/565; 219/121.59
[58] Field of Search ......................... 148/565; 219/121.59

[56]                References Cited

U.S. PATENT DOCUMENTS

| | | | |
|---|---|---|---|
| 3,146,336 | 8/1964 | Whitacre .................................. | 219/121 |
| 4,382,186 | 5/1983 | Denholm et al. ....................... | 148/565 |
| 4,829,189 | 5/1989 | Goto et al. .............................. | 250/492 |
| 5,354,963 | 10/1994 | Muller et al. ........................... | 148/565 |

FOREIGN PATENT DOCUMENTS

| | | |
|---|---|---|
| 87547 | 10/1989 | Belgium . |
| 0 461 011 A1 | 12/1991 | European Pat. Off. . |
| 0 560 526 A1 | 5/1993 | European Pat. Off. . |
| 3723 865 A1 | 1/1988 | Germany . |

OTHER PUBLICATIONS

*Patent Abstracts of Japan*, vol. 002, No. 085, JP 53–045612, Apr. 1978.

*Patent Abstracts of Japan*, vol. 095, No. 004, JP 07–018465, Jan. 1995.

*Patent Abstracts of Japan*, vol. 095, No. 001, JP 06–279843, Oct. 1994.

*Primary Examiner*—George Wyszomierski
*Attorney, Agent, or Firm*—Pillsbury Madison & Sutro, LLP

[57]            ABSTRACT

A process for annealing a moving metal substrate, especially a steel sheet. The process includes providing a gas under reduced pressure facing a first side of the substrate, creating a cold plasma in the gas by means of plasma discharges between the substrate and a counter electrode, the plasma being uniformly divided over the width of the substrate, and dissipating electrical power from the plasma discharges into the substrate, resulting in a uniform distribution of the density of power over the width of the substrate and a quick and uniform heating thereof

11 Claims, 1 Drawing Sheet

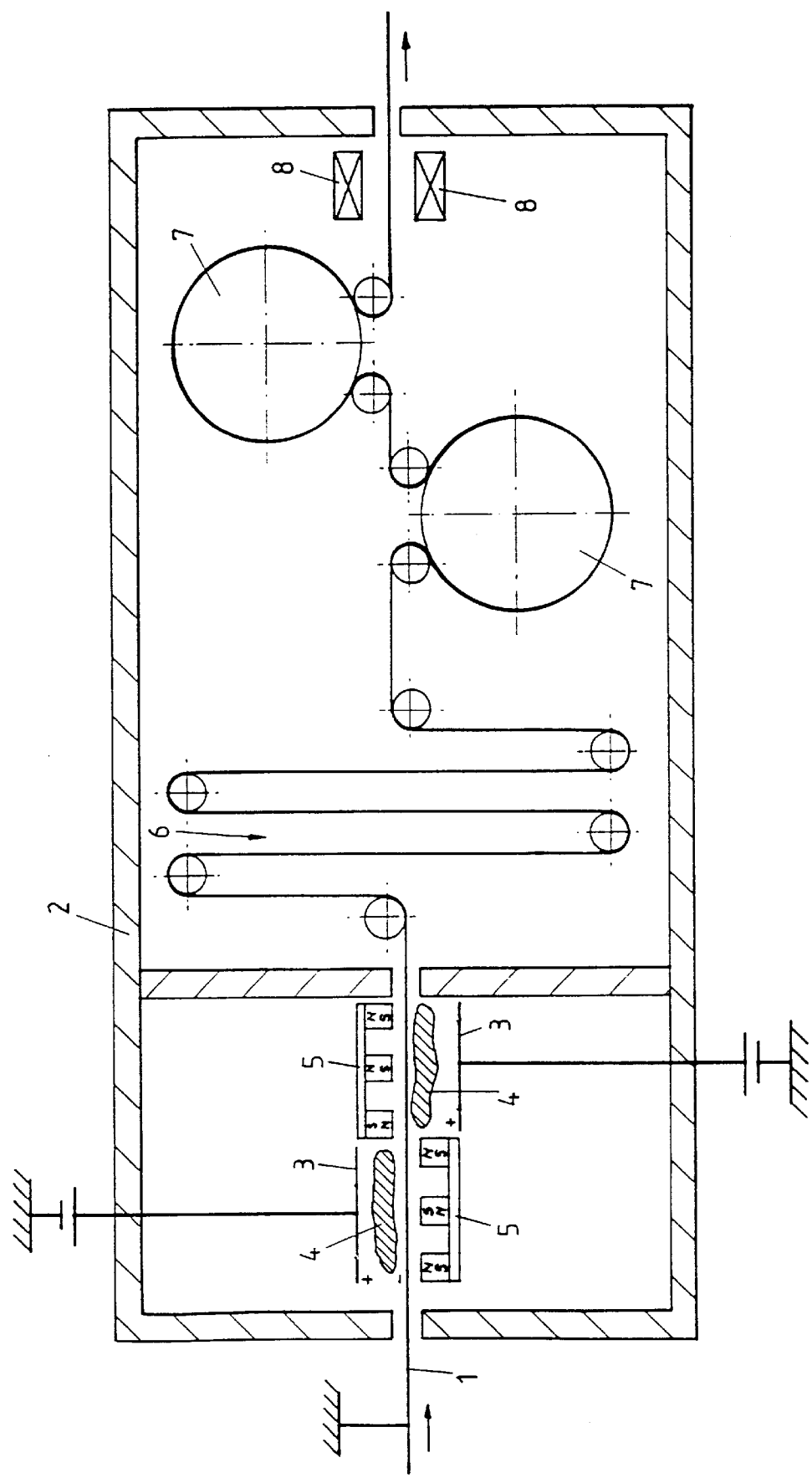

PROCESS FOR ANNEALING A MOVING METAL SUBSTRATE

The present invention relates to a continuous process for annealing a moving metal substrate, especially a steel sheet.

The continuous annealing techniques applied nowadays and according to which the substrates to be treated are subjected to relatively high temperatures show different disadvantages.

For example the thermal inertia of the installations for performing these known processes is very important. The consumption of reducing gas necessary for avoiding oxidation of the substrates is high. It is impossible to obtain, in one single annealing operation, a surface state which is such that a further layer can be deposited so that, in general, a supplementary pickling step is required. Since use is made in the known annealing installations as heating means of radiant tubes, these installations are of an important size and involve, moreover, high maintenance costs. When use is made of induction heating at medium frequency for annealing ferromagnetic substrates, one is limited to temperatures below the Curie temperature. Finally, heating systems at medium and high frequencies show a bad energy efficiency.

One of the essential objects of the present invention consists in proposing a process which obviates the above-mentioned disadvantages and which allows, moreover, a combination of a recrystallisation step at high speed and at an appropriate temperature, with such a preparation of the surface that this surface allows deposition of a further finishing layer without having to subject this surface for example to a supplementary pickling operation.

To this end, the annealing is realised according to the invention by means of plasma discharges.

Advantageously, the annealing is performed at a pressure comprised between $10^{-4}$ and 100 Torr.

More particularly according to the invention, said discharges are established between the substrate and a counter electrode in a manner such as to dissipate the electrical power from the discharges into the substrate.

According to a preferred embodiment, the annealing is realised in a reducing atmosphere, for example in the presence of hydrogen, methane, a nitrogen-hydrogen mixture or further an argon-hydrogen mixture, or in an oxidising atmosphere or in an oxidising atmosphere followed by a reducing atmosphere.

According to another preferred embodiment of the process according to the invention, use is made of a discharge of the magnetron type, the substrate being at the cathode and the pressure being comprised between 0.001 and 1 Torr. /

Other details and particularities of the invention will become apparent from the description which is given hereinafter by way of non limiting example of a particular embodiment of the process according to the invention with reference to the single annexed figure which is a schematic illustration of an installation for carrying out the process according to the invention. /

In the description which is given hereafter, the reference numerals relate to this figure.

In a general way, the invention concerns a process for annealing a moving metal substrate which is preferably composed of a steel sheet 1 travelling in a substantially continuous way through an annealing chamber 2 wherein the annealing is realised by means of plasma discharges.

This chamber 2 is composed of a closed enclosure wherein a pressure prevails which is generally comprised between $10^{-4}$ and 100 Torr, and which is preferably lower than 10 Torr.

When passing through this chamber 2, the discharges are established between the sheet 1 and a counter electrode 3 in such a way that the electrical power from the discharges is dissipated in this sheet 1 and that hence the annealing is achieved. A recrystallisation at high speed is thus obtained, which enables one to obtain relatively fine grains, for example for the production of high-resistance steel.

In fact, it is therefore a cathodic sputtering process during which the sheet is bombarded with ions coming from a plasma 4 enabling a quick and uniform heating and, at the same time, a pickling of the surface thereof.

According to the invention, the plasma can be created with direct current, the sheet forming thus the cathode, or with alternating current.

In the latter case, use is made of a counter-electrode 3 extending in the annealing chamber 2, opposite the sheet 1, and showing a surface directed towards the sheet, the surface area of which is higher than the one of the sheet portion situated in front thereof in order to maintain a negative autopolarisation of this sheet.

Just like in the conventional cathodic sputtering process, the discharge may optionally be realised in the presence of magnetic induction fields thanks to the presence of magnets 5 near the sheet 1 and on the side opposite thereof with respect to the counter-electrode 3.

The power densities dissipated per side onto the steel sheet 1 are typically between 1 W/cm$^2$ and 500 W/cm$^2$, whilst the travelling speeds of this sheet are generally between 1 m/min and 1500 m/min.

The increase of temperature takes place within the sheet area wherein the power is dissipated whereas the rate of the temperature increase depends on the adjustment of the used power density, the line speed as well as the thickness of the sheet and its heat capacity.

In certain cases, it may be useful to introduce a temperature stabilising stage in the annealing cycle. This can be obtained for example by providing within the annealing chamber 2 an area wherein the sheet travels freely under a reduced pressure. In such a case, it is for example sufficient to provide a compartment 6 which is somewhat insulated from the one wherein the plasma is generated. In this respect, it should be noted that, at a reduced pressure, the heat losses by conduction are limited and the radiation losses can be returned to the sheet by means of reflectors or by auxiliary radiant heating means.

In still other cases, it may be useful to cooled down the sheet 1 in the annealing chamber 2, thus under a reduced pressure, for example by passing the sheet over cooling cylinders 7. So, still within the annealing chamber 2, one could also consider, if necessary, coating the sheet 1 with a finishing or protective film, for example by a PVD ("physical vapour deposition) process, PECVD ("plasma enhanced chemical vapour deposition") process or by a CVD ("Chemical vapour deposition") process by means of a vacuum deposition device 8.

The so treated sheet may leave the annealing chamber 2 at a temperature which is compatible with the end of the metallurgical process.

Let us further mention that the annealing can be realised under reducing atmosphere, for example in the presence of hydrogen, methane, a nitrogen-hydrogen mixture or further an argon-hydrogen mixture. If necessary, a plasma precleaning can be effected under an oxidising atmosphere, for example to eliminate oils present after a laminating step. This oxidising atmosphere may be formed by an argon-oxygen mixture optionally containing $CF_4$ and could be followed by a reducing atmosphere.

Some examples of practical realisations which enable to further illustrate the process according to the invention are giving hereinafter.

Example 1
Treatment of a cold laminated, uncoated steel sheet running past

| | |
|---|---|
| Line speed | 200 m/min |
| Band width | 1000 mm |
| Band thickness | 1 mm |
| Annealing entry temperature | 20° C. |
| Maximum annealing temperature (plateau) | 700° C. |
| Maintaining time | 30 s |
| Cooling rate (till 20° C.) | 50° C./s |

Under these conditions, the temperature increasing area was limited to a length of 10 m for a useful power of 10 MW, thus creating a temperature increase rate in the order of 224° C./s. The temperature maintaining area required a useful length of 100 m. The sheet was pleated which enabled to reduce the heat losses to a minimum. Further, use was made of cooling cylinders with a useful circumferential length in the order of 2.5 m so that 20 cylinders were needed to come to the ambient temperature. After the outlet lock, the sheet has been enrolled in the form of a roll.

Example 2
Treatment of a white iron sheet

| | |
|---|---|
| Line speed | 800 m/min |
| Band width | 1000 mm |
| Band thickness | 0.18 mm |
| Annealing entry temperature | 20° C. |
| Maximum annealing temperature (no maintaining) | 600° C. |
| Cooling rate (till 20° C.) | 6° C./s |

Under these conditions, the temperature increasing area was limited to a length of 7 m for a useful power of 10 MW, thus creating a temperature increase rate in the order of 1200° C./s. The sheet has been cooled down from 600° C. to 420° C. at a speed of 6° C./s, which required a cooling length of 400 m. The cooling has been assured by Jet cooling, after the outlet lock, under controlled atmosphere. Then, the sheet has been tinned or passivated.

Example 3
Treatment of a sheet for immersion galvanising

| | |
|---|---|
| Line speed | 140 m/min |
| Band width | 1000 mm |
| Band thickness | 1 mm |
| Annealing entry temperature | 20° C. |
| Maximum annealing temperature (plateau) | 800° C. |
| Maintaining time | 20 s |
| Cooling rate (till 500° C.) | 100° C/s |

Under these conditions, the temperature increasing area was limited to a length of 7 m for a useful power of 10 MW, thus creating a temperature increase rate in the order of 260° C./s. The temperature maintaining area required a useful length of 47 m. The sheet was also pleated to enable to minimise the heat losses. The sheet was cooled down from 800° C. to 500° C. at a rate of 100° C./s, which required a useful cooling length of 7 m on cooling cylinders (3 cylinders with a useful circumferential length of 2.5 m). After having left the installation through the lock, the sheet was immersed in a liquid zinc bath at 490° C., dried and cooled down.

An alternative consisted in cooling the sheet down to 100° C., which required 3 supplementary cooling cylinders, and in coating it immediately with a protective or finishing film by vacuum evaporation (for example by sputter evaporation) without coming back to atmospheric pressure. After the outlet lock, the sheet has been SKIN passed, oiled and enrolled.

It is clear that the invention is not limited to the here above described embodiments and that many variants can be considered without leaving the scope of the present invention, especially as to the generation of the annealing plasma, the magnetron confinement which, at relatively high pressure, could be omitted, the cathode, which could be a hollow cathode formed by the sheet moving in zigzag or in accordion.

Further, the process is not limited to the treatment of steel sheets but may be suited for any other type of metal requiring annealing optionally combined with a surface treatment.

One of the important differences of the invention with respect to the prior state of the art consists in the type of plasma used for heating the metal band which is to be treated. Indeed, in the process according to the invention, use is made of what is commonly called "cold plasmas" which are uniformly divided over the entire width of the metal band whereas in the known processes use is either made of arc plasmas characterized by local hot spots on the surface of the metal band or of hot plasma jets also with a very local action on the surface to be treated. This very local action thus necessarily requires systems for quickly displacing the hot spots with respect to the substrate, i.e. systems which enable desplacement of the arcs or plasma jets by means which are independent of the movement of the metal band. Such a displacement of hot spots is generally indispensable to lead to an average density of the energy dissipated per surface area unit which is constant over the width of the sheet. The process according to the invention does not pose such a problem since the density of the power dissipated in the sheet is uniformly distributed over the entire treated width of the metal band.

What is claimed is:

1. A process for annealing a moving metal substrate in the form of a sheet having a width, comprising:
   providing a gas under reduced pressure facing a first side of the moving substrate, creating a cold plasma in said gas by means of plasma discharges between the substrate and a counter electrode, said plasma being uniformly divided over the width of the sheet, and
   dissipating electrical power from the plasma discharges into the substrate with a uniform distribution of the density of power over the width of the sheet and a quick and uniform heating of the metal substrate.

2. A process according to claim 1, wherein the annealing is performed at a pressure comprised between $10^{-4}$ and 100 Torr.

3. A process according to claim 1 or 2, comprising creating the discharges in the presence of magnetic induction fields.

4. A process according to claim 3 including locating magnets near the substrate on a second side of the substrate, opposite the counter-electrode, to produce said magnetic induction fields.

5. A process according to claim 1 to 2, comprising performing the annealing in a reducing atmosphere, an oxidising atmosphere, or in an oxidising atmosphere followed by a reducing atmosphere.

6. A process according to claim 1 or 2, wherein the substrate is caused to run at a speed between 1 m/min and 1500 m/min.

7. A process according to claim 1 or 2, wherein use is made of a magnetron plasma discharge, the substrate being at the cathode and the pressure being between 0.001 and 1 Torr.

8. A process according to claim 1, wherein the plasma is created with direct current, the substrate forming a cathode.

9. A process according to claim 1, wherein the plasma is created with alternating current, and said counter electrode extends opposite the substrate and shows, in a determined volume, a surface directed towards the substrate, the surface area of which is larger than the surface area of the portion of the substrate present in this volume in order to maintain a negative autopolarisation of this substrate.

10. A process according to claim 1 further comprising:

providing an additional gas under reduced pressure facing a second side, opposite to the first side of the moving substrate, creating an additional plasma in said additional gas by means of plasma discharges between the substrate and an additional counter electrode, said additional plasma being uniformly divided over the width of the sheet, and dissipating electrical power from the plasma discharges into the substrate with a uniform distribution of the density of power over the width of the sheet and a quick and uniform heating of the metal substrate.

11. A process according to claim 1, wherein the annealing is performed at a pressure lower than 10 Torr.

* * * * *